United States Patent [19]
Banks et al.

[11] Patent Number: 5,520,967
[45] Date of Patent: May 28, 1996

[54] SOLDER APPLICATION TO A CIRCUIT BOARD

[75] Inventors: Peter M. Banks; William M. Morgan, both of Chandlers Ford, England

[73] Assignee: International Business Machines Corporation, Armonk, N.Y.

[21] Appl. No.: 24,991

[22] Filed: Mar. 2, 1993

[51] Int. Cl.$^6$ .................................................. B06B 1/20
[52] U.S. Cl. .......................... 427/601; 427/96; 427/436
[58] Field of Search ......................... 118/416; 427/431, 427/436, 601, 96

[56] References Cited

U.S. PATENT DOCUMENTS

| | | | |
|---|---|---|---|
| 3,859,722 | 1/1975 | Kinsky et al. | 29/626 |
| 3,945,618 | 3/1976 | Shoh | 259/114 |
| 4,592,944 | 6/1986 | Clark et al. | 427/96 |
| 4,637,541 | 1/1987 | Tanny | 228/180.1 |

FOREIGN PATENT DOCUMENTS 1181421 2/1970 United Kingdom .
1457325 12/1976 United Kingdom .

OTHER PUBLICATIONS

IBM Technical Disclosure Bulletin, vol. 18, No. 10, Mar. 1976, pp. 3182–3183.
IBM Technical Disclosure Bulletin, vol. 24, No. 11A Apr. 1982, p. 5726.
IBM Technical Disclosure Bulletin, vol. 27, No. 1A, Jun. 1984, "Vibration Soldering Equipment", by J. L. Backes et al., pp. 71–72.
3114665 (Japan) May 15, 1991 Abstract.
2050492 Feb. 20, 1990 (Japan) Abstract.

*Primary Examiner*—Shrive Beck
*Assistant Examiner*—Katherine A. Bareford
*Attorney, Agent, or Firm*—Michael E. Belk

[57] ABSTRACT

Solder is applied to a circuit board 7 by dipping the board into a bath 1 of molten solder 3, the molten solder having a layer of oil 5 on top. The board is dipped into the bath by rotating it along a path that is substantially coplanar with the circuit board. This is achieved by supporting the board on a carrier 9 which in turn is attached to a motor shaft 11.

14 Claims, 3 Drawing Sheets

5,520,967

SOLDER APPLICATION TO A CIRCUIT BOARD

AREA OF ART

This invention relates to the application of solder to a circuit board by dipping the board into a solder bath.

BACKGROUND

A typical circuit board comprises a substrate having a pattern of copper conductive tracks formed onto it. The substrate can either be rigid, as in a printed circuit board (PCB), or flexible (the term "circuit board" will be used to cover both types). Active and passive electronic components are soldered onto the board via a set of pads arranged around the periphery of a component site. Each pad is the termination of a conductive copper track providing an input/output line to that component.

In one standard manufacturing process for PCBs the copper pads are protected from oxidation before the components are attached by coating the pads with a thin layer of solder (the tracks themselves are normally protected by a polyimide coverlay). The pads are first cleaned in a flux solution which comprises a mixture of acid cleaner and solvent and sometimes oil, and then immersed into a bath of molten solder. On withdrawal from the bath, solder only adheres to the exposed copper pads, but not to other regions of the PCB. It is important to ensure that an even coating of solder is applied, and one way of doing this is with a hot air solder levelling (HASL) machine, such as that described in GB 1457325. In a HASL machine, as the PCB is lifted out of the solder bath, it is blasted by jets of hot air from nearby nozzles which blow away excess solder. GB 1181421 describes an alternative method of removing excess solder by shaking or vibrating the circuit board after removal from the solder bath. In GB 1181421 the solder bath is covered by a thin layer of peanut oil.

As an alternative to immersion in a solder bath, it is also possible to use a solder wave process to coat the circuit board with solder. Another slightly different solder apply process is described in IBM Technical Disclosure Bulletin, 1982, Vol 24, No 11A, P5726 in which the level of solder in the tank is raised rather than the board lowered. The solder is covered by a thin layer of a glycerine solution to prevent oxidation of the solder, which overflows when the solder level is raised. The circuit board is vibrated while in the solder.

After the solder application stage, electronic components such as packaged silicon chips are mounted onto the PCB. The components usually have either a set of leads for soldering to the pads, or terminals on the component can be directly bonded onto the pads (such as with surface mount passive components). In either approach, additional solder is applied to the pads at this stage, typically by screening. This solder is used for bonding the components to the pads. As the size of the electronic components for such circuits has shrunk, so has the spacing of the pads surrounding them. In some cases adjacent pads are no more than 0.12 mm apart (approximately equal to the width of the pads themselves). Solder screening techniques are not at present capable of depositing such finely-spaced patterns of solder.

IBM Technical Disclosure Bulletin 1976 Vol 18 No 10 P3182–3183 describes one possible way around this problem, by applying solder to the components rather than the board. The components are pivoted through a solder bath and on removal from the bath, an oscillatory motion is produced using a spring stop to remove excess solder. Applying solder to the components rather than the board has the disadvantage that often the components have leads which need to be shaped, and this is hard to do once they have been coated in solder. Also, difficulties have been experienced in producing reliable joints, which are believed to be due to metallurgical problems at the bond between the lead and the solder.

SUMMARY OF THE INVENTION

The art does not provide a reliable method of applying a sufficient and controlled amount of solder to circuit boards to allow advanced components with very small pad spacing to be mounted onto the board.

Accordingly, the present invention provides a method of applying solder to a circuit board by dipping the board into a bath of molten solder, the molten solder being covered by a layer of oil;

the method being characterized in that the circuit board is dipped into the bath by rotating the board through the solder bath along the path substantially coplanar with the circuit board.

Somewhat surprisingly, the method has been found to give excellent uniformity of solder height on pads (in this context, solder height is used as an easily measurable parameter of solder volume). Such uniformity is important, because too little solder will produce a poor bond, while too much can lead to shorts between adjacent pads. The uniformity of solder height obtained by the present invention is believed to be due to the smoothness of the rotary motion, and also to the layer of oil, which prevents the temperature gradient on exit from being too great. This allows the solder on the pad to equilibrate into the correct shape, and avoids drag-out artifacts. The equilibration process is also responsible for the correct amount of solder being deposited onto the pads. This is in contrast to solder screening, where a fixed quantity of solder is simply dumped onto the pads, and HASL, where the amount of solder is determined by the air jets.

The path of the board through the bath is most conveniently a circular arc, but could be some other suitably curved or arcuate shape, e.g., a cycloid, especially if it were necessary to reduce the size of solder bath, but this would require a more complicated drive mechanism. Preferably, the exit angle of the board from the solder bath is between 35 and 55 degrees. This angle can be measured between the vertical and the main axis of the board, and since most rectangular pads are aligned with this main axis, the diagonals of such pads are approximately vertical on exit from the solder bath. The orientation of the rectangular pads on exit has proved to be important in achieving uniformity of solder height.

Another significant parameter is the angular velocity of the board through the solder bath. A preferred rotation rate for the board is between 1 and 4 rpm. A slower rotation rate also provides an acceptable distribution of solder heights, but clearly reduces the throughput of the apparatus. Variation of the rotation rate through the solder bath has been found to provide some control over the amount of solder deposited on the pads, with the solder height adjustable by about a factor of two depending on the rotation rate used. A faster rotation rate leads to more solder being retained on each pad, but also to diminished uniformity in solder height.

It is advantageous to vibrate the board while it is in the molten solder, preferably in a direction perpendicular to the plane of the path of rotation, this having been found to be useful in improving the solder coating of pads where the surrounding coverlay opening is relatively small. A vibration frequency of approximately 100 Hz has been used. Since vibrations have been found to have a potentially adverse effect on solder height distribution, it is preferred to only vibrate the board during the first part of its motion through the solder bath, but not during exit from the bath. The board vibrations are perpendicular to a plane of the board.

The invention also provides apparatus for applying solder to a circuit board comprising a carrier for supporting the board, and drive means for moving the carrier to dip the circuit board into the solder bath; characterized in that the drive means is operable to rotate the circuit board through the solder bath along a path substantially coplanar with the circuit board.

Preferably the apparatus further comprises means for vibrating the carrier in a direction perpendicular to the plane of said path.

BRIEF DESCRIPTION OF THE DRAWINGS

The invention will now be described with reference to the following drawings.

DETAILED DESCRIPTION OF THE DRAWINGS

Figure 1:
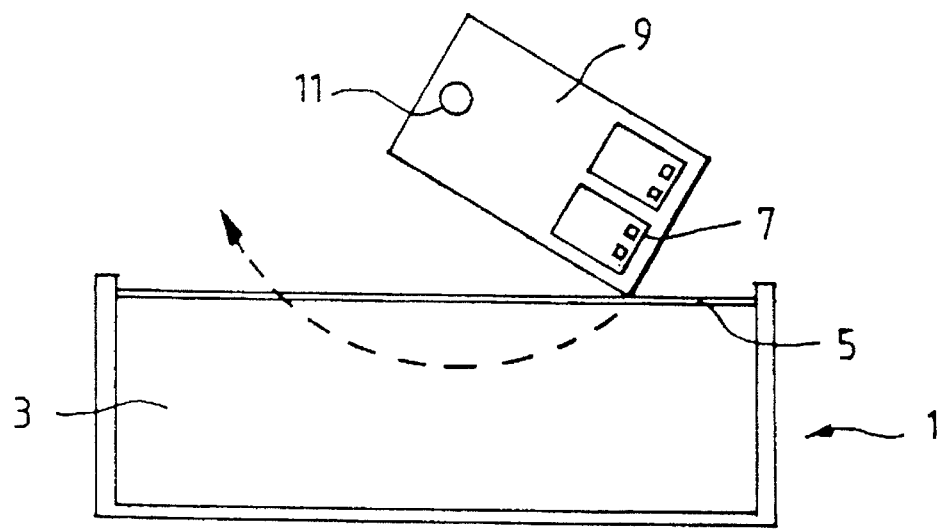
FIG. 1 is a simplified front view of the solder immersion apparatus of the present invention.
Figure 2:
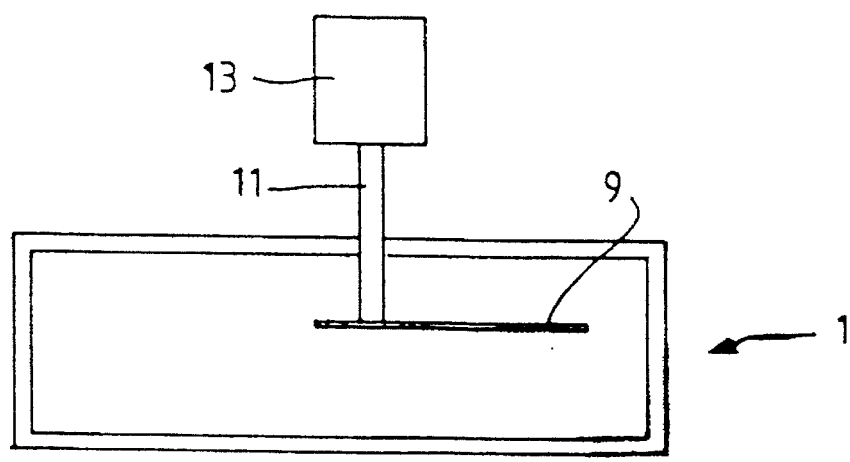
FIG. 2 is a simplified plan view of the solder immersion apparatus of the present invention.

FIGS. 1 and 2 illustrate solder immersion apparatus in accordance with the present invention. A bath 1 contains molten solder 3, which is typically a eutectic mixture of 63% tin and 37% lead at a temperature of approximately 220 degrees centigrade, although other compositions and temperatures can be used. On top of the solder is a layer of oil 5, such as a polyoxyalxylene glycol of ether, which prevents oxidation of the molten solder and the formation of dross. The oil also serves another important purpose as explained below. The circuit board 7 to be coated is mounted on a titanium carrier 9 (titanium is used because it is non-wetting in solder). The carrier in turn is supported by a shaft 11, which can be rotated by a motor 13. The height of the shaft can be adjusted and the motor speed, and hence the rotation rate of the shaft, is also controllable.

Figure 3:
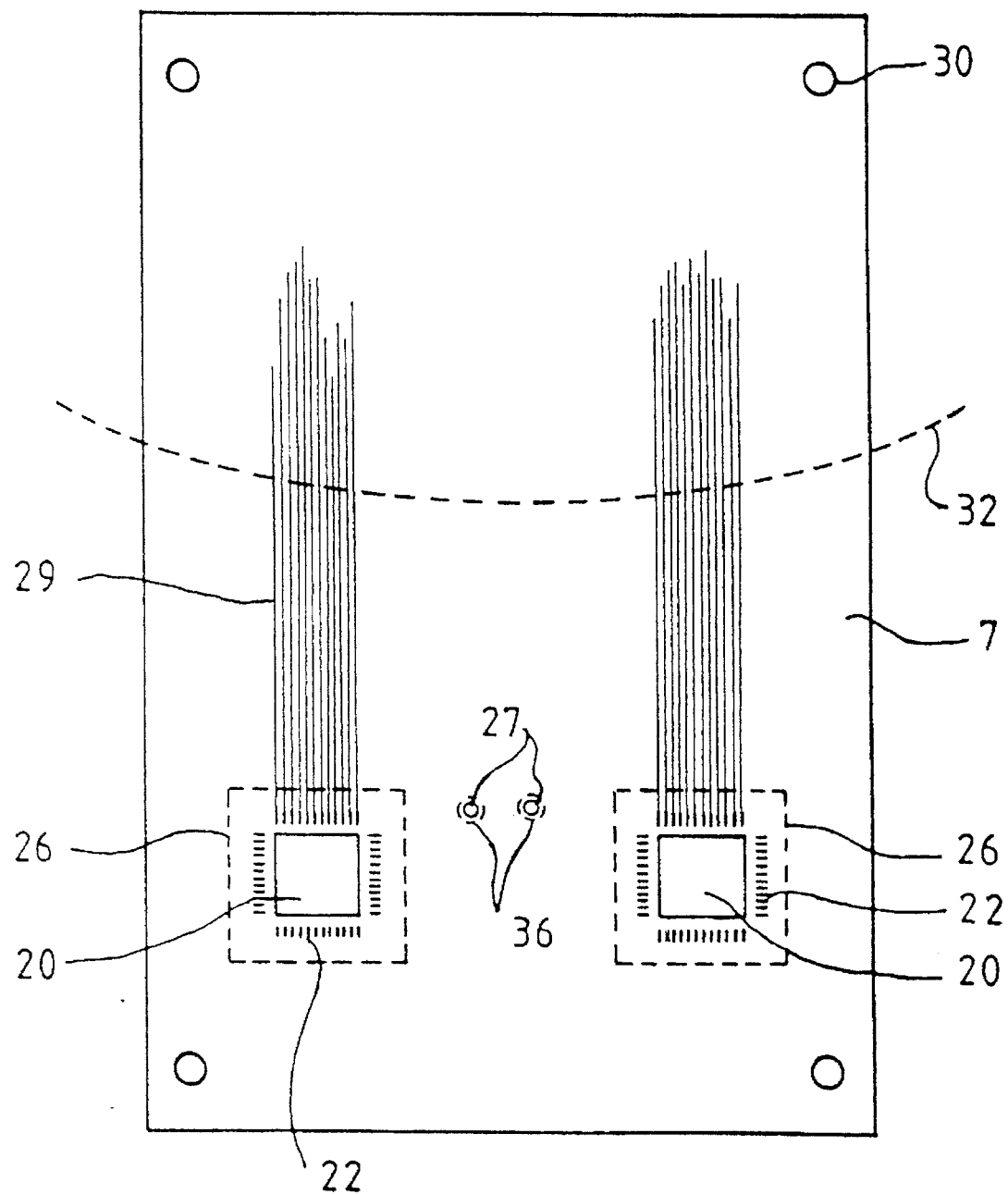
FIG. 3 is a schematic view of a circuit board to which solder is to be applied.

FIG. 3 is a schematic diagram of a circuit board with a flexible substrate made from a copper polyimide laminate. The present invention has been developed primarily with such flexible circuit boards, but is also applicable to circuit boards have rigid substrates. For the former, the carrier must be at least coextensive with the board to support it, but with rigid substrates the carrier can just be a device for attaching the board to the shaft, and need not necessarily enter the solder itself. The board has two component sites 20 surrounded by a series of copper pads 22. Each pad represents the termination of a copper track 29 (not all of these are shown). The limits of the coverlay that protects the copper tracks from oxidation are marked by borders 26 which surround the component sites. Inside the borders 26 are the exposed pads (and parts of tracks) that are to be coated with solder. Holes 30 are provided for fastening the circuit board to the carrier 9.

Before soldering, the board is first cleaned or "fluxed" in a mixture of flux, acid cleaner, and oil to remove oxidation from the pads. The board is then rotated along an arc through the solder bath, with a rotation speed of about 2 revolutions per minute (this adjustable). FIG. 3 shows the line 32 of deepest immersion. The total arc length through the solder is about 90 degrees, with corresponding entry and exit angles of approximately 45 degrees (this represents the angle on entry/exit between the vertical and the main axis of the copper tracks, shown vertically in FIG. 3).

This technique has been used to apply solder to a circuit board in which the pads are only 0.15 mm across. The specifications for solder height in this case are between 5 and 50 microns—if there is less solder than the bond formed will be poor, whereas with excess solder adjacent pads may short together. Solder height will only be a valid indication of the solder volume if the solder on a pad has properly equilibrated (i.e., formed a minimum energy shape as dictated by surface tension). An important feature of the present invention is that the layer of oil on the solder reduces the temperature gradient on exit, and allows time for the solder to reflow into this equilibrium shape, thereby avoiding drag-out artifacts.

Figure 4:
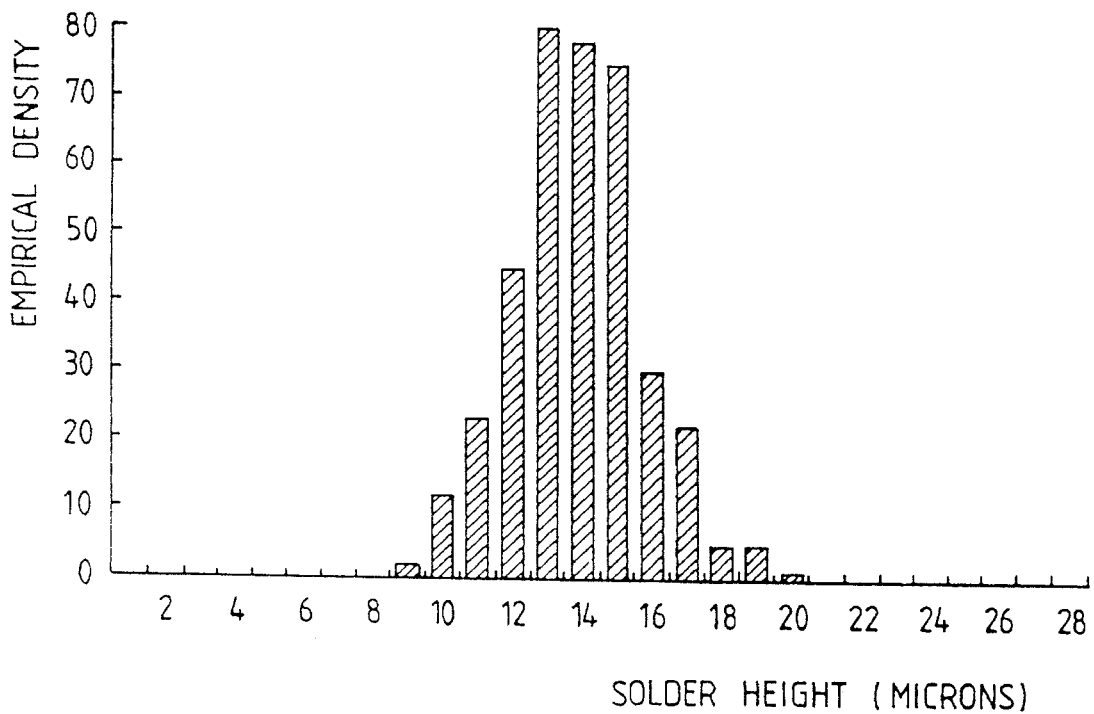
FIG. 4 is a chart illustrating the distribution of solder heights obtained using the present invention.

FIG. 4 illustrates test data showing the distribution of measured solder height of pads from a number of boards. These results exhibit a high degree of uniformity of solder height, with a standard deviation for a normal fit less than 2 microns. Clearly this is well within the process specifications given above (in this particular ease the mean is deliberately offset to the lower end of the specification range to meet solder coating requirements elsewhere on the board; it is not a feature of the invention). The mean applied solder height can be controlled somewhat (within a range of about a factor of two) by adjusting the speed of the circuit board through the solder. A faster rotation rate results in a thicker coating of solder, but less uniformity in solder height.

Some problems with non-wetting have been encountered at probe sites 27 on the board (see FIG. 3). These are circular pads included for testing purposes. The difficulty appears not to be directly due to the size or shape of the pads themselves, but rather the small diameter (or more accurately, the relatively small ratio of width to depth) of the associated aperture in the coverlay 36 (the probe sites 27 and coverlay apertures 36 have been somewhat enlarged in FIG. 3 for clarity). Whereas the component pads occur in rows and are encompassed by just a single opening in the coverlay, the probe sites are scattered and each has its own small coverlay hole associated with it. It is likely that these holes fill up with oil on entry into the solder bath, and subsequently the solder has difficulty displacing the oil from such small apertures due to the surface tension of the oil. Consequently, solder is prevented from properly coating these sites.

To overcome this problem, a vibrator is attached to the carrier. Vibration has been found to help prevent non-wetting by displacing the oil from the coverlay apertures, but is also liable to diminish solder height uniformity. To avoid this, therefore, the board is only vibrated during the first part of its path through the solder, when it is important to ensure solder wetting of all the pads. The vibrator is then switched off to allow the solder to equilibrate properly on exit from the bath. For a flexible circuit board, the vibrations are coupled to the board by rigidly attaching the board to the carrier at various points, e.g., by pins or clips, some of which will be immersed in the solder. In contrast, if the circuit board is a rigid PCB, vibrations may be transmitted from the non-immersed part of the board to the immersed part via the board itself. It may be possible to attach the vibrator directly to the PCB itself, but this would probably be less convenient from a manufacturing point of view. The frequency of vibrations used is 100 Hz, but a very wide range of frequencies (including possibly ultrasonics) is likely to be suitable for this task. In some circumstances, vibration may not fully prevent non-wetting of the probe sites or other features of similar dimension. If this is the case, additional solder can be applied to the probe sites by screening at a later stage. This is possible because the probe sites are isolated, and so the alignment and amount of solder deposited are not critical. Indeed, it is only because they are isolated that there is the problem with the aperture size in the coverlay. Thus it is not essential for the vibration alone to completely prevent non-wetting, although it is desirable since it avoids the need for separate screening onto the probe sites.

Another difficulty encountered was with cylindrical through-holes in the circuit board into which ground pins can be inserted to ground the board. The rims of these holes on the upper surface of the board comprise annular copper lands, while the interior of the holes are non-conductive. The problem was that a hemispherical solder skin tended to form across the hole, instead of an annular coating on the land. An effective remedy to this is to use titanium pins that extend through the apertures, allowing the lands to be properly coated with solder.

Figure 5:
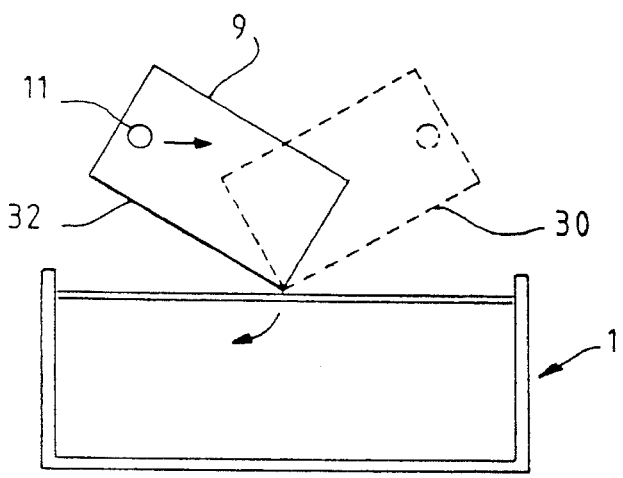
FIG. 5 illustrates a modification of the apparatus of FIG. 1 that permits a smaller solder bath to be used.

One potential disadvantage of the present invention compared to the prior art is that a bigger solder bath is required. If necessary, this can be alleviated by adapting the path of the board through the solder. For example, the shaft 11 and carrier 9 can be moved laterally from left to right at the same time as they are rotated clockwise. This is illustrated in FIG. 5, which shows the position of the carrier on entry 32 and on exit 30 (dotted line) from the solder bath. This motion provides essentially the same rotation and exit angle and hence uniformity of solder height as the apparatus of FIG. 1, but allows a smaller solder bath to be used at the expense of a slightly more complicated drive mechanism. Other suitable forms of motion and appropriate implementations will be readily apparent to the skilled person.

We claim:

1. A method of applying solder to a circuit board, comprising the steps:

providing a bath of molten solder;

inserting titanium pins extending through holes in the board to provide proper solder coating at the holes; and moving the board through the bath; and removing the pins from the holes.

2. The method of claim 1, wherein an angle between a main axis of the board and a top surface of the bath as the board is withdrawn from the bath, measured in a plane of the board, is between 35 and 55 degrees.

3. The method of claim 1 further comprising the step of vibrating the board while it is communicating with the molten solder at an amplitude less than the width of the board.

4. The method of claim 3, wherein the board vibrations are perpendicular to a plane of the board.

5. The method of claim 3, wherein the board is not vibrated during exit from the bath.

6. The method of claim 3 wherein a vibration frequency of the board is approximately 100 Hz.

7. The method of claim 1, wherein the board is moved approximately along a circular arc while communicating with the molten solder.

8. The method of claim 7 in which the board rotates approximately about a center of the circular arc path as the board moves through the bath.

9. The method of claim 1, wherein a rotation rate of the board as it is moved through the bath, is between 1 and 4 rpm.

10. The method of claim 1 in which the board is rotated smoothly as it moves through the bath without any jerk or vibration in its direction of progress through the bath that would effect the results of the process.

11. The method of claim 1 further comprising the step of covering the molten solder with a layer of oil.

12. The method of claim 1 in which a plane defined by the board is about perpendicular to a top surface of the bath as the board moves through the bath.

13. The method of claim 1, further comprising:

providing conductive, solder wettable, pads on the surface of the board;

providing a coverlay with rectangular openings to expose the pads, and wherein the board is moved so that upon exiting from the bath an edge of the openings form an angle with a top surface of the bath in a plane of the board, of between 35 and 55 degrees.

14. The method of claim 1, further comprising vibrating the board in a direction which is about perpendicular to board progress through the bath and parallel to a top surface of the bath, while immersed in the bath.

* * * * *